(12) United States Patent
Golovchenko et al.

(10) Patent No.: US 7,435,353 B2
(45) Date of Patent: Oct. 14, 2008

(54) PATTERNING BY ENERGETICALLY-STIMULATED LOCAL REMOVAL OF SOLID-CONDENSED-GAS LAYERS AND SOLID STATE CHEMICAL REACTIONS PRODUCED WITH SUCH LAYERS

(75) Inventors: Jene A. Golovchenko, Lexington, MA (US); Gavin M. King, Boulder, CO (US); Gregor M. Schürmann, Neuchâtel (CH); Daniel Branton, Lexington, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 326 days.

(21) Appl. No.: 11/008,402

(22) Filed: Dec. 9, 2004

(65) Prior Publication Data
US 2007/0262050 A1  Nov. 15, 2007

(51) Int. Cl.
*C23C 14/34* (2006.01)
*B82B 3/00* (2006.01)
(52) U.S. Cl. .................. 216/41; 216/58; 219/121.2; 204/192.34; 204/192.35; 427/585; 427/331; 427/372.2; 427/551; 427/552; 427/553; 427/555; 427/532; 977/856; 977/857; 977/888; 977/890; 977/891
(58) Field of Classification Search ............ None
See application file for complete search history.

(56) References Cited

U.S. PATENT DOCUMENTS

| 4,348,473 A | * | 9/1982 | Okumura et al. ............ 430/296 |
| 4,535,023 A | | 8/1985 | Whitlock |
| 6,014,259 A | * | 1/2000 | Wohlstadter ................ 359/619 |
| 7,238,294 B2 | * | 7/2007 | Koops et al. ................ 216/62 |
| 2007/0134420 A1 | * | 6/2007 | Koberstein et al. ........ 427/258 |

FOREIGN PATENT DOCUMENTS

| DE | 43 18 663 C1 | 10/1994 |
| EP | 0 233 747 A2 | 8/1987 |
| WO | WO 03/088340 A2 | 10/2003 |
| WO | WO 2004/079450 A1 | 9/2004 |
| WO | WO 2006/063098 A1 | 6/2006 |

OTHER PUBLICATIONS

Mednikarov, "Dependence of the dissolution characteristics of As2S3 as a photoresist on the condensation rate and evaporation temperature," Jnl. of Vacuum Science and technology, Part B, V. 7, N. 3, pp. 561-564, May 1989.

(Continued)

*Primary Examiner*—Anita K Alanko
(74) *Attorney, Agent, or Firm*—Theresa A. Lober

(57) ABSTRACT

The invention provides a method for forming a patterned material layer on a structure, by condensing a vapor to a solid condensate layer on a surface of the structure and then localized removal of selected regions of the condensate layer by directing a beam of energy at the selected regions. The structure can then be processed, with at least a portion of the patterned solid condensate layer on the structure surface, and then the solid condensate layer removed. Further there can be stimulated localized reaction between the solid condensate layer and the structure by directing a beam of energy at at least one selected region of the condensate layer.

61 Claims, 5 Drawing Sheets

OTHER PUBLICATIONS

Johnson et al., "Condensed Gas, In Situ Lithography," IBM Technical Disclosure Bulletin, vol. 20, No. 9, pp. 3737-3738, Feb. 1978.

Brown et al., "'Sputtering' of Ice by MeV Light Ions," Phys. Rev. Lett., vol. 40, No. 15, pp. 1027-1030, Apr. 10, 1978.

Brown et al., "Linear and Nonlinear Processes in the Erosion of H2O Ice by Fast Light Ions," Phys. Rev. Lett., vol. 45, No. 20, pp. 1632-1635, Nov. 17, 1980.

"Laser-Induced Sublimation of GaAs For Semiconductor Masks," IBM Technical Disclosure Bulletin, vol. 31, No. 7, pp. 34-35, Dec. 1988.

"Selective Deposition With 'Dry' Vaporizable Lift-off Mask," IBM Technical Disclosure Bulletin, vol. 35, No. 1A, pp. 75-76, Jun. 1992.

King et al., "Nanometer Patterning with Ice," Nano Letters, vol. 5, No. 6, pp. 1157-1160, Jun. 2005.

Gutzow et al., "On the mechanism of formation of amorphous condensates from the vapour phase, (1). General theory," Jnl. of Non-Crystalline Solids, vol. 16, pp. 128-142, 1974, no month available.

Hobbs, "Ice Physics," pp. 1, 52, 53, Oxford University Press, London, 1974, no month available.

Sack et al., "Sublimation of vapor-deposited water ice below 179 K, and its dependence on growth conditions," Physical Review B, Third Series, vol. 48, No. 14, pp. 9973-9978, Oct. 1, 1993.

Debenedetti, "Supercooled glassy water," J. Phys.: Condens. Matter, vol. 15, pp. R1669-R1726, 2003, no month available.

Safarik et al., "Thickness dependent crystallization kinetics of submicron amorphous solid water films," Jnl. of Chemical Physics, vol. 118, No. 10, pp. 4660-4671, Mar. 8, 2003.

Angell, "Amorphous Water," Annual Rev. Phys. Chem., vol. 55, pp. 559-583, Feb. 3, 2004.

Chaplin, "Amorphous Ice and Glassy Water," taken from "Water structure and Science," http://www.lsbu.ac.uk/water/amorph.html, updated Dec. 10, 2007.

Chaplin, "Water Phase Diagram," taken from "Water Structure and Science," http://www.lsbu.ac.uk/water/phase.html, updated Jan. 18, 2008.

* cited by examiner

PATTERNING BY ENERGETICALLY-STIMULATED LOCAL REMOVAL OF SOLID-CONDENSED-GAS LAYERS AND SOLID STATE CHEMICAL REACTIONS PRODUCED WITH SUCH LAYERS

STATEMENT REGARDING FEDERALLY SPONSORED RESEARCH

This invention was made with Government support under Contract No. F-49620-01-1-0467, awarded by DARPA and under Contract No. DE-FG02-01ER45922, awarded by DOE. The Government has certain rights in the invention.

CROSS-REFERENCE TO RELATED APPLICATION

This patent application is being concurrently filed with U.S. patent application Ser. No. 11/008,438, entitled "Lift-Off Patterning Processes Employing Energetically-Stimulated Local Removal of Solid-Condensed-Gas Layers," by Branton et al., published as US 2007/0128357, the disclosure of which is hereby incorporated by reference.

BACKGROUND OF THE INVENTION

This invention relates to controlled, patterned removal of solid state materials and further relates to control of chemical reactions carried out on solid state materials.

Modern solid state microfabrication technologies have evolved to encompass the production of microstructures and nanostructures for both electronic and microelectromechanical (MEMS) systems. Exotic substrate and component materials are increasingly employed in complicated three-dimensional system arrangements. Historically and conventionally, the building blocks of microfabricated system componentry have been produced by imparting patterns to solid state structures and by imposing selective chemical processes, such as impurity doping, material removal, and material growth, on solid state materials. The term "solid state" is here used to refer to non-biological materials generally.

In the production of both electronic and MEMS systems, nanometric feature control of solid state structures is increasingly becoming a microfabrication concern. In addition, selective chemical processing of unconventional solid state materials and structures, often arranged in intricate configurations, is increasingly becoming a microfabrication challenge. There have been established a wide range of microfabrication techniques for producing and controlling structural dimensions and chemical reactions on solid state materials. For example, high resolution lithographic techniques and high-precision additive and subtractive material processing techniques have been proposed to enable small-scale feature fabrication. But in the fabrication of many micro- and nano-regime systems, in which structural feature dimensions of a few nanometers can be of importance and in which exotic materials and intricate structural configurations are often employed, conventional techniques often cannot form the requisite nano-scale features reproducibly or without harming system materials, and often cannot provide selective chemical processing of the materials predictably or without harming system materials. As a result, volume manufacture of many systems that include microscale or nanometric feature dimensions and/or unconventional materials and configurations is not practical or economical.

SUMMARY OF THE INVENTION

The invention overcomes the limitations of conventional processing techniques by providing a method for forming a patterned material layer on a structure wherein a vapor is condensed to a solid condensate layer on a surface of the structure. Selected regions of the condensate layer are then locally removed by directing a beam of energy at the selected regions. The structure can then be processed if desired, with at least a portion of the patterned solid condensate layer on the structure surface, and then the solid condensate layer removed. Further there can be stimulated localized reaction between the solid condensate layer and the structure by directing a beam of energy at at least one selected region of the condensate layer.

A wide range of structures and processes are enabled by the condensate formation, localized condensate removal, and processing and/or localized chemical surface interactions enabled by the invention. Specifically, the use of a patterned condensate layer enables a wide range of microfabrication techniques for producing electronic and optoelectronic devices. Other features and advantages will be apparent from the following description and accompanying figures, and from the claims.

DETAILED DESCRIPTION OF THE INVENTION

Figure 1A:
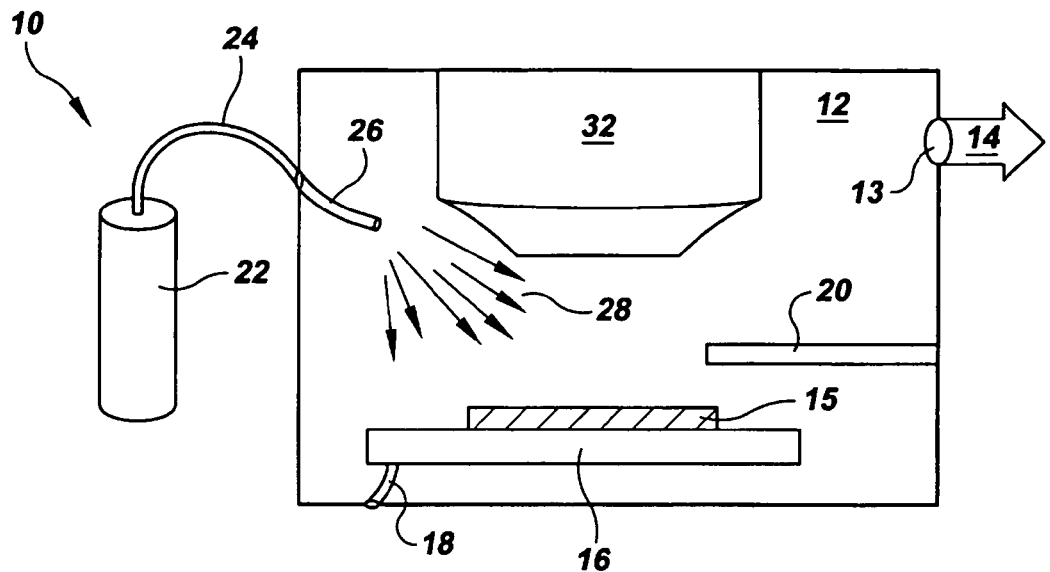
FIGS. 1A-1E are schematic views of a processing chamber and associated elements provided by the invention for forming and removing a solid condensate layer and for processing a structure underlying the condensate layer.

Referring to FIG. 1A there is shown a schematic view of a system 10 for carrying out solid-condensed-gas layer process techniques provided by the invention. The system 10 includes a chamber 12 having a pump port 13 for pumping the chamber to a desired pressure by delivery 14 to, e.g., a vacuum pump. A structure 15 to be processed in accordance with the invention is provided on a structure holder 16. In the example configuration shown in FIG. 1A the structure 15 is illustrated as a planar substrate, but such is not required by the invention; as discussed in detail below, three-dimensional structures in a wide range of configurations can be employed. The structure holder 16 can be provided with a suitable connection 18 to enable electrical and thermal control of the structure, e.g., for cooling the structure, where such is required for a given application. Additional thermal control elements can be provided in the chamber 12. For example a conventional cold finger 20 can be positioned for pumping the chamber in the immediate vicinity of the structure.

Figure 1B:
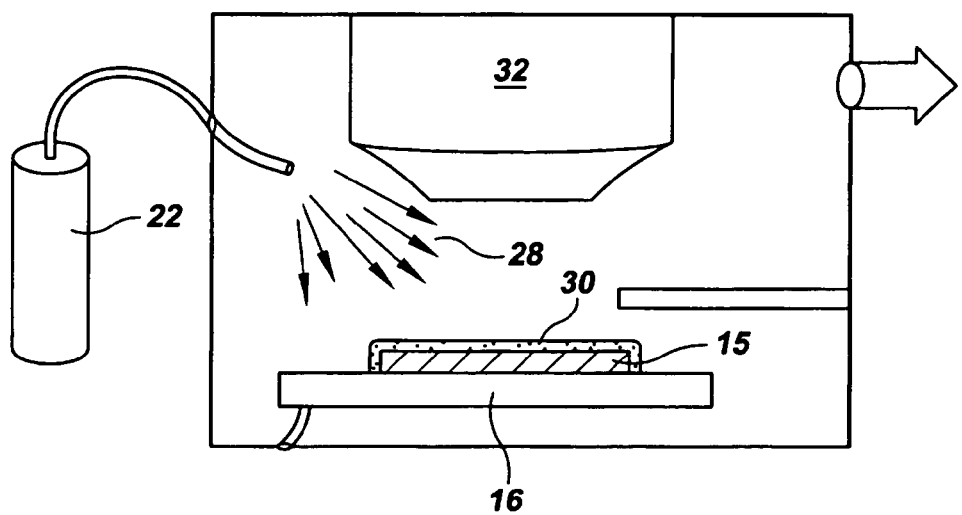

Referring also to FIG. 1B, a source 22 is attached through a connection 24 to an injector 26 for providing a vapor 28 that condenses to a solid condensate layer 30, that is, a layer of solid-condensed-gas. As shown in FIG. 1B, the conditions of the chamber are set such that the solid-condensed-gas layer forms on the structure 15. Solid-condensed-gas may also form on other parts of the chamber as well, but for the purposes of the invention, solid condensate formation on the structure 15 is all that is required.

Figure 1C:
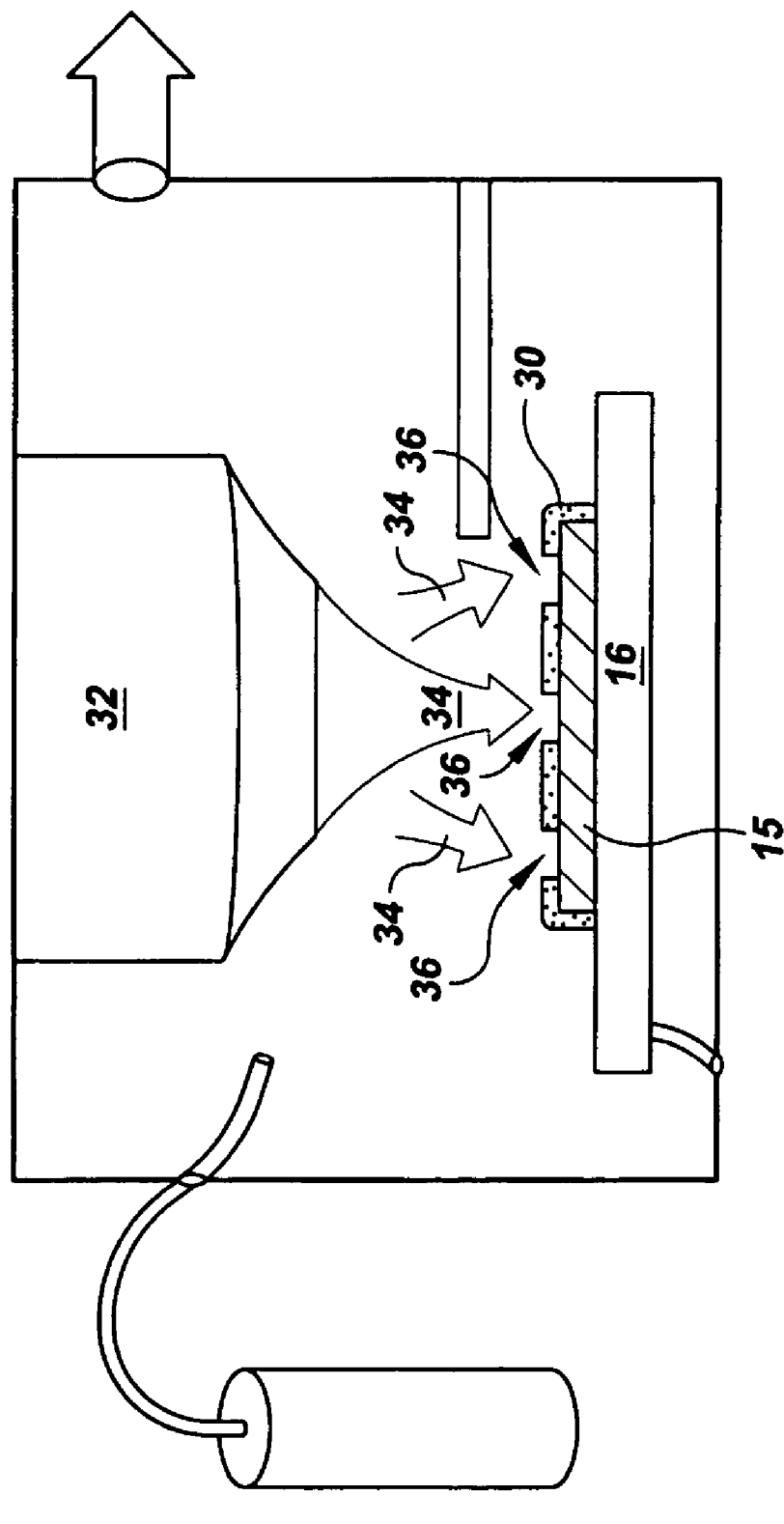

Referring also to FIG. 1C, the chamber 12 is provided with one or more sources 32 of an energetic beam 34 or beams that can be controllably directed to locations of interest 36 on the solid condensate layer 30. The energetic beam 34 is controlled, under the chamber conditions, to cause the solid condensate 30 to be removed locally, only at the locations of interest to which the beam is directed. The beam stimulates local removal of the solid condensate. As explained in detail below, in this removal process, the solid condensate can be converted from the solid phase to the gas phase by the energetic beam. In one technique provided by the invention, the stimulated local removal of the solid condensate layer 30 by the energetic beam 34 is continued to locally remove the layer completely, whereby the structure 30 is exposed under the condensate layer at the locations to which the beam is directed. While the solid condensate layer is being removed and after the layer is removed, processing of the structure can be carried out. Afterward, the remaining solid condensate layer portions can be removed by any of a number of techniques, and preferably are removed by converting the layer from the solid phase back to the gas phase. Aspects of each of these process techniques are described in detail below.

First considering the characteristics of solid condensate layer in more detail, such is formed in accordance with the invention by the condensing of a vapor to the solid phase. The originating source 22 of the vapor can be one or more solid, liquid, vapor-phase gas, vapor, gas, or other constituents or a combination of constituents. All that is required is the delivery of a vapor 28 to the process chamber 12 for condensation on a structure 15 in the chamber. For example, atomization, sublimation, or sputtering techniques, or other suitable solid, liquid, or vapor phase chemical processing can be employed for producing the vapor to be condensed.

The constituents of the vapor to be condensed are selected based on the characteristics of the structure, the energetic beam to be employed for stimulated local removal of the solid condensate layer, and any processing of the structure to be carried out with the solid condensate in place on the structure. It is preferred in accordance with the invention that the solid-condensed-gas layer be removed from the structure by conversion from the solid phase to the gas phase. Given that the solid-condensed-gas layer is also formed by conversion from the gas phase to the solid phase, high vapor pressure materials can be good candidates for the condensate.

In one example in accordance with the invention, the vapor source 22 includes a source of water vapor to enable production of vapor 28 in the chamber that includes, or alternatively that is composed substantially entirely of, water vapor. Because of the wide availability, low cost, ease of handling, and other positive attributes of water, such can be a preferred vapor candidate for many applications. Water vapor can be condensed from the vapor phase to the solid phase under appropriate temperature and pressure conditions, can be selectively locally removed by stimulated interaction with an energetic beam, and can be converted from the solid phase back to the vapor phase without production of residue or contaminants. Water vapor thereby enables production of a solid condensate layer that can be easily and controllably formed as well as removed.

Referring back to FIG. 1A, in an example process provided by the invention for producing a solid-condensed-gas layer from water vapor, a source 22 of water vapor, e.g., liquid water, Epsom salts, sulfate, or other high vapor pressure solid that can vaporize, or other vapor source, is provided. The injector 26 to the chamber can here be provided as, e.g., a simple leak valve, a mass flow controller, or other suitable injector. For the controlled production of thin solid condensate layers from water vapor, it can be preferred to control introduction of the water vapor. Given that the injector may include a tube nozzle that produces directional vapor injection, a highly controllable valve or other controller can be preferred along with a diffuser or other device for enabling diffusivity of vapor introduction to the chamber.

It is found that the proximity of the vapor injector of the chamber to a structure in the chamber on which a solid condensed layer is to be formed can impact the solid condensate formation. Specifically, it is found that shadowing and point source effects can occur for close injector proximities. It is therefore preferred that the scale of the structure be considered relative to the distance from the structure holder to the chamber injector. A relatively larger distance can be preferred for larger structure surfaces, with the injector and/or structure holder positioning adjusted accordingly. In addition or alternatively, parallel vapor sources, e.g., shower head arrangements, can be employed.

Continuing with the example process for producing a solid-condensed-gas layer from water vapor, the structure of interest 15 is provided on the sample holder 16 and connection 18 is made for enabling electrical grounding of the sample for applications in which a charged energetic beam species is to be employed. For applications in which an electrically charged energetic beam species is employed, it can be preferred to make such an electrical connection, rather than electrically isolating the sample, to enable draining of the energetic beam species charge from the sample. The structure holder 16 is then thermally controlled to regulate the structure temperature for applications in which such local cooling is preferred. Accordingly, it can be preferred for many applications to ensure that the structure makes good thermal, electrical, and mechanical contact with the structure holder. Double-sided carbon tape, silicon grease, or other aid can here be employed.

The structure temperature is regulated based on the solid condensate species selected. In the example employing water vapor, the structure temperature is held below a temperature at which the water vapor condenses to form a solid ice condensate layer. For many applications, it can be preferred to maintain the structure temperature at 180 K or less, and more preferably to maintain the structure temperature at 130 K or less to enable formation of a uniform, smooth, and conformal solid ice condensate layer. This particular temperature range is not required by the invention, however. Rather, the invention requires that the temperature be maintained no higher than that temperature at which a solid condensate layer, e.g., an ice layer, sublimes to vapor so rapidly that the layer is completely removed before an energetic beam can cause the solid condensate to be removed locally.

As explained below, solid condensate layer characteristics of uniformity, smoothness, and conformality, typically ascribed to an amorphous, vitreous layer, can be preferred for enabling optimal coverage of the structure and for enabling precise control of local removal of the solid condensate by an energetic beam. The process chamber can be maintained at room temperature, with the structure holder controlling the substrate temperature, and/or the chamber itself can be employed to cool the structure. Local temperature regulation of the sample can be preferred for enhancing control of such. Where the structure holder is employed to regulate the structure temperature, a cryostage or other cryogenically-cooled structure holder can be preferred for applications in which solid condensate formation is to be carried out in the 100 K range.

As shown in FIG. 1A, a cold finger 20 can also be employed for controlling the temperature local to the structure. Such a cold finger is not required, particularly where the process chamber is known to be quite clean. Otherwise, it can be preferred to employ a cold finger to attract stray water, hydrocarbons, and other contaminants in the chamber. The cold finger is here preferably set at a temperature that is less than that of the structure so that the net flux of contaminants is greater onto the cold finger rather than the structure. For the water vapor example here, with a structure temperature set at less than about 130 K for condensation of the water vapor, a cold finger temperature of about 77 K, produced by liquid nitrogen cooling, can be preferred. The cold finger can be positioned quite close to the structure holder, and preferably is set as close as possible to the structure.

In addition to thermal control, there is required the control of the pressure of the vapor in the vicinity of the structure on which a solid condensate layer is to be formed. The background pressure of the process chamber is not in general as important as the pressure local to the structure, which more closely dictates the solid condensate formation. Specifically, it is found that the local pressure directly impacts the solid condensate formation characteristics and rate. For example, it is found that uniform, smooth, conformal solid ice condensate layers can be formed from water vapor when the condensate layer is produced at a rate less than about 25 nm/sec. Given a structure temperature less than about 180 K, a local pressure that is less than about $10^{-4}$ T can be employed for achieving this solid condensate formation rate.

It is recognized in accordance with the invention that before a vapor is introduced into a chamber for solid condensate formation, it can be preferred to impose a base chamber pressure to assure a relatively clean vacuum environment from which no or only a few unwanted molecules may condense on a structure during the vapor condensation. For the example process employing water vapor, a pressure less than about $10^{-6}$ T can be preferred as such a base chamber pressure. Once this base pressure is reached, a selected condensation pressure can then be imposed based on the vapor species and other characteristics. For the example of water vapor condensation, a condensate formation pressure higher than the base pressure, e.g., between about $10^{-4}$-$10^{-6}$ T, can be preferred for many applications.

Continuing with the example employing water vapor, once the structure temperature has been regulated to less than about 180 K and the pressure local to the structure has been regulated to a selected pressure, e.g., less than about $10^{-4}$ T, injection of the water vapor to the chamber can commence. As the water vapor enters the chamber, a pressure gauge or other monitoring device can be employed to follow the vapor injection. It can be preferred to employ a pressure gauge that can monitor the pressure local to the structure. In general, an empirical calibration of the chamber conditions can be employed to relate solid condensate formation rate with a pressure reading.

The solid-phase condensation of the water vapor can also be monitored in situ, during the solid condensate formation, with electron beam imaging of the structure. Referring back to FIG. 1A, the beam source 32 can be adapted to accommodate an electron beam apparatus, e.g., a scanning electron microscope (SEM) apparatus, for scanning the structure as a solid condensate layer is formed and producing a corresponding image of the structure. As the structure is scanned by the electron beam, the secondary electron yield from the structure changes in correspondence with the solid condensate layer formation, and such changes are reflected in the brightness of the structure image. Similarly, IR absorption measurements can be made in situ. These in situ techniques enables real time monitoring of the water vapor condensation process.

It has been found experimentally that solid condensate formation from water vapor onto a silicon substrate held at a temperature of about 128 K and a local pressure of about $10^{-4}$ T results in a solid condensate layer, here termed as a water ice layer, that is stable and does not degrade. It is known that at a temperature of about 128 K, ice sublimes at a rate of only about 0.3 monolayers/hour with a sublimation energy of about 0.45 eV. As a result, so long as the temperature and pressure conditions of the chamber are maintained at the stated levels, the water ice layer is stable and will not significantly sublime or otherwise degrade.

Under the solid ice condensate formation conditions just given it has been found experimentally that the ice condensate is smooth, uniform, and conformal and appears to be amorphous at the resolution of a SEM image. With SEM monitoring of the ice condensate layer while the temperature of the silicon wafer was increased to about 153 K, it was experimentally found that the ice condensate surface image transitions from a smooth to a granular appearance. This granular transition corresponds to the amorphous-to-cubic ice phase transition temperature of ice, and indicates that maintenance of an ice condensate layer at temperatures below about 130 K can maintain a stable amorphous morphology. It is recognized in accordance with the invention that temperatures above 130 K can be employed where the morphology of the resulting solid ice condensate layer is acceptable.

In accordance with the invention, a solid ice condensate layer can be formed selectively at specific locations of a structure surface, by self-assembly processes. For example, conventional self-assembly processes can be employed to produce arrangements of layered regions on the structure surface that are selectively hydrophobic or hydrophilic. With such an arrangement of hydrophobic and hydrophilic surface regions, condensation of water vapor can be carried out to form a solid ice condensate layer only on the hydrophilic surface regions.

Once the water vapor processing described above is completed to form a solid ice condensate layer of a selected thickness, stimulated local removal of that ice layer can be carried out in the manner described above and explained in more detail below. The remaining ice layer can then be removed, also as explained below.

Turning first to vapor species other than water vapor, the invention contemplates a wide range of alternative vapor constituents. In general, all that is required of the vapor constituents in the production of the solid condensate layer is the conversion from the vapor phase to the solid phase. This criterion can be met for many vapors with chamber temperature and pressure conditions that are practical for many applications. One skilled in the art will recognize that the chamber temperature and pressure can be regulated to produce process conditions that enable vapor-to-solid conversion. It is under these conditions that a selected vapor can be introduced to the vicinity of a structure for solid condensation on the structure.

For example, as explained above with reference to water vapor condensation, at a structure temperature below about 130 K and a local pressure of less than about $10^{-6}$ T, smooth, uniform, conformal, and stable ice condensate layers can be formed. Corresponding pressure-temperature combinations can likewise be determined for other selected vapor species; in other words, the temperature and pressure ranges at which a given vapor species will condense from the vapor phase to the solid phase are identified and the most suitable conditions for a given application are selected. So long as a suitable pressure-temperature combination can be practically implemented for a given application, the corresponding vapor species is a candidate for the solid condensate formation. For example, given the low cost and availability of liquid nitrogen, a pressure-temperature combination that enables vapor-to-solid condensation at liquid nitrogen temperatures can be employed in a corresponding application.

There are a number of other considerations to be made in selection of vapor species. It is to be recognized that in the process of local stimulated removal of a solid condensate layer by an energetic beam, described in detail below, the beam produces a profile of energy that can reach the surface of the structure below the solid condensate layer. This can result in chemical interaction between the condensate layer and the structure, also as explained in more detail below. The reactivity of the solid condensate layer as well as that of the structure can also be enhanced by the energy of the beam. Further, reaction of the solid condensate layer with the ambient of the process chamber can be induced by the energy of the beam.

Therefore, if it is desired to minimize or inhibit reactions of the solid condensate layer and/or the structure material, then it can be preferred to employ inert gas species for producing the solid condensate layer. Inert gases, or rare gases, including argon, krypton, zenon, neon, xenon, or radon can be employed. Liquid nitrogen, alcohols, methane, and other vapor species can also be employed.

A further consideration for vapor species selection relates to removal of the solid condensate layer. As described briefly above, once processing of the structure with the solid condensate layer in place is complete, the solid condensate layer is removed, and preferably is removed by conversion back to the vapor phase. The vapor species therefore is preferably selected to produce a solid condensate layer that can be removed by conversion to the vapor phase, e.g., through heating, as in the previous example of condensed water vapor, and as explained in detail below.

Referring back to FIG. 1C, whatever vapor species is selected, once the species is condensed to form a solid condensate layer 30 on a structure 15, an energetic beam 34 is directed to selected locations 36 of the layer 30 to cause stimulated local removal of the layer. To enable application of this local removal process to nanometric dimensions and intricate structural configurations, the uniformity, smoothness, and conformality conditions for the layer described above are preferred. Amorphous layers in general tend to be uniform, smooth, and conformal and thus can be preferred for many applications. But an amorphous morphology is not an absolute requirement of the layer.

It is recognized that interaction of an energetic beam 34 with the solid condensate layer 30 can be crystal orientation-dependent. In addition, removal of the solid condensate layer by conversion to vapor, e.g., by sublimation, can be crystal orientation-dependent, in that the sublimation energy can depend on the crystal orientation. Therefore, if a polycrystalline or crystalline solid condensate layer is required or if an amorphous morphology is not achievable, then it can be preferred for many applications that the crystals of the crystalline morphology be rendered as small as possible.

In accordance with the invention, an energetic beam is directed to selected locations of a solid condensate layer to cause stimulated local removal of the layer. In this process, energy of the beam locally interacts with the layer, resulting in localized layer removal. The beam species for causing this localized removal is therefore preferably selected based on the energy deposition profile and the focusing capabilities of the beam for a given solid condensate species. More specifically, the achievable resolution for a locally removed condensate region is directly impacted by the ability to localize an energetic beam. The beam species, energy, dose, and other characteristics can also be empirically optimized to further enable high resolution.

For many applications an electron beam can be preferred as the energetic beam species. An electron beam can be highly focussed, the energy of the electron beam can be controlled, and the beam can be scanned. As an electron beam interacts with a solid condensate layer, the electron beam can alter the electrical and structural state of the condensate layer by the traversal of electrons through the layer and by the deposit of electrons in the layer. This energetic interaction is understood to be highly localized in that it is substantially electrical, rather than molecular, in nature. As the energetic interaction progresses, the solid condensate is removed at the location of the interaction, e.g., by stimulated erosion, sublimation, ablation, ionization, or other mechanism. The local removal can be continued until, as shown in FIG. 1C, the solid condensate layer 30 is completely removed at the locations of interest 36, exposing the underlying structure 15.

The energy of an electron beam to be directed at a condensate layer is preferably selected based on the thickness of a solid condensate layer under consideration. In general, for a given condensate layer thickness, an increase in electron beam energy results in an increase in the resolution of the stimulated local condensate removal. Accordingly, for a given electron beam energy, a reduction in solid condensate thickness results in an increase in the resolution of the stimulated local condensate removal. An increase in electron beam energy can also, under certain circumstances, enable a higher degree of beam focus. It will be recognized by one skilled in the art that some empirical analysis can be preferred for enabling optimization of electron beam conditions for a given condensate layer thickness.

Considering example experimental results for electron beam-stimulated local removal of a solid ice condensate layer, a solid ice condensate layer of about 75 nm in thickness was produced on a silicon substrate at a temperature of about 128 K and a pressure of about $10^{-4}$ T, employing a water vapor source of Epsom salts. After the ice condensate layer was formed, the substrate was maintained at the 128 K temperature. Thereafter, an electron beam having an energy of 5 KeV and a focus diameter of about 5 nm was directed to and scanned across a 500 nm square location on the ice condensate layer. An electron beam dose of at least about $8.8 \times 10^5$ $\mu C/cm^2$ was required to completely remove the ice condensate layer and expose the underlying silicon surface in the 500 nm square location.

It was found by SEM inspection that the 75 nm-thick ice condensate layer exhibited an amorphous morphology. Assuming that the amorphous ice condensate layer had a density of about 0.91 $gm/cm^3$, the stimulated local removal yield of the ice condensate layer for the 5 KeV electron beam is determined to be about 0.03. In other words, for each incident electron directed to the ice condensate layer, 0.03 ice condensate molecules are removed from the layer. It was found that this removal yield decreases as the electron beam energy is increased. For example, as the beam energy is increased from 1 KeV to 30 KeV, the ice condensate removal yield was experimentally observed to decrease by over an order of magnitude. Conversely, it was experimentally observed that the ice condensate removal yield does not vary significantly as the temperature of the substrate is increased from 128 K to 158 K.

It is of interest to compare the line width resolution that can be obtained by electron beam removal of an ice condensate layer with the line widths that are typically achieved with conventional photoresists such as polymethyl methacrylate (PMMA) and electron beam processing. While minimum line widths of less than 10 nm have been demonstrated with electron-beam exposed PMMA, such results have typically required specialized high energy beams, e.g., beams greater than 100 KeV in energy, and specialized processing, such as ultrasonication during the PMMA development. A line width more typically achieved with electron-beam exposed PMMA on a bulk silicon substrate, with commercial electron beam lithography tools, is on the order of about 30 nm. In contrast, the invention enables electron beam patterning, in the manner of lithography, of an ice condensate layer to produce pattern linewidths of less than 20 nm with relatively low electron beam energies and no specialized equipment.

The invention contemplates a wide range of energetic beam species that can be employed to locally remove a solid condensate layer. For example, ion beams can be employed as the energetic beam species. It is to be noted, however, that the typically relatively large mass and corresponding low speed of ions can cause damage to or ion implantation of a structure underlying a solid condensate layer and/or the condensate layer itself as an ion beam is directed to the layer. The condensate removal yield of an ion beam is found to be substantially greater than that for an electron beam, and thus for applications in which a high removal yield is desired, an ion beam can be preferred. In addition, an inert ion beam would be preferable for applications in which chemical interaction of the beam with the condensate layer and/or the underlying structure is to be minimized.

In one example process provided by the invention for locally removing regions of a solid ice condensate layer having a thickness of 300 nm by an ion beam, a focussed $Ga^+$ ion beam having an energy of 30 KeV, an amperage of 10 pA, and a diameter of about 10 nm removed local solid ice regions with a linewidth as narrow as about 20 nm.

Other candidate beam species include, e.g., atomic beams such as neutral atomic beams, molecular beams, cluster beams, proton beams, alpha particles, X-ray beams, optical beams, and other suitable beam species. Beams that can be highly localized can be particularly advantageous, and the invention contemplates the use of highly focussed beams where applicable. In general, for these or other selected energetic beams, the beam characteristics are selected to cause stimulated local removal of the solid condensate. For example, characteristics such as the wavelength and power of an optical beam can be selected to cause stimulated local removal of a given solid condensate layer. In one example of such a selection, it is recognized that water highly absorbs optical wavelengths less than about 170 nm. Therefore, given a solid ice condensate layer, it can be preferred to employ a relatively low optical wavelength for stimulating local removal of the solid ice condensate layer.

In addition or alternatively, it can be preferable to adjust the beam absorption characteristics of the solid condensate to optimize the ability of a given beam to interact with a layer of the condensate. It is recognized that beam energy can be absorbed differently by differing solid condensate species. Therefore, the solid condensate constituents can be selected to optimize the energy absorption of a given beam species by the condensate. For example, a dye can be added to a solid ice condensate layer to tune the optical absorption properties of the ice layer where an optical beam is to be employed for local removal of the ice layer. Here a water vapor source can be modified to include a dye such that a solid ice condensate layer includes the dye. Similarly, given the use of an electron beam, the constituents of a solid condensate layer can be adjusted to tune the layer's electronic properties such that the electron absorption of the layer is optimized for a given application.

Referring back to FIG. 1C, whatever beam species is employed, the energetic beam 34 can be directed to locations 36 of a solid condensate layer 30 to cause stimulated local removal of the layer. The beam can be scanned to form desired patterns of locally removed regions of the layer. Such patterns can be continuous or discontinuous, and can be produced at various locations of the structure. In addition, multiple beam species can be employed at various locations of the structure and/or at a common location, depending on the removal requirements for a given condensate layer and/or desired removal arrangement.

With local removal of a solid condensate layer complete to form one or more patterns at the desired locations of the layer, processing of the structure can be carried out, with the remaining, now patterned, solid condensate regions in place on the structure, if desired. For example, referring to FIG. 1D, regions 38 of the structure 15 can be removed at locations that are exposed where the condensate layer 30 was previously removed. The patterned condensate layer acts as a mask for shielding the structure from the etch or other mechanism employed to remove the structure at the selected exposed locations. Here it can be particularly advantageous to form the condensate layer of an inert material that is impervious to an etchant selected for etching the structure.

Figure 1D:
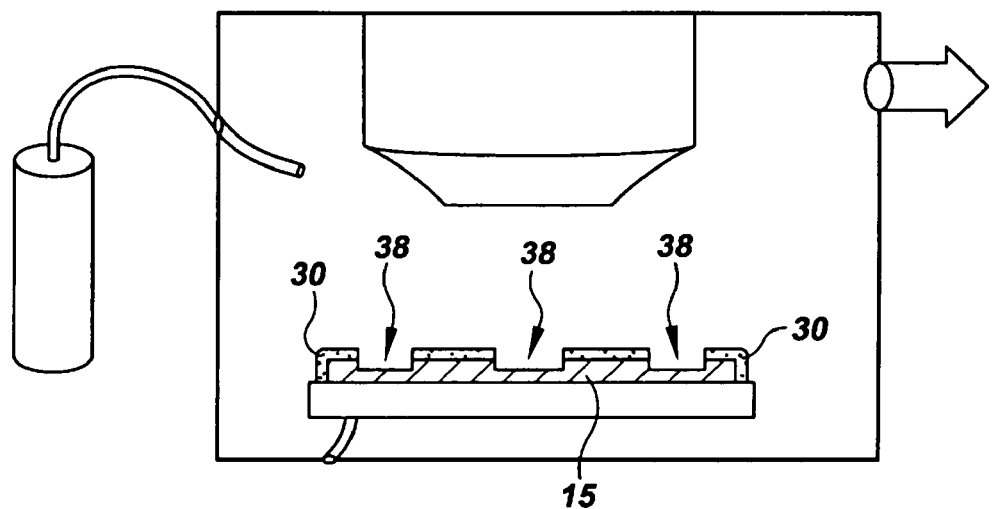
Figure 1E:
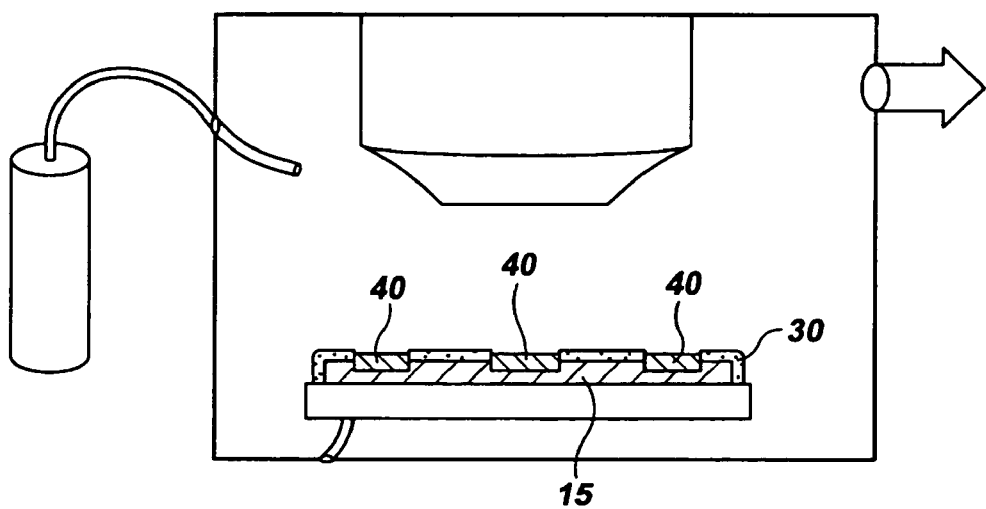

Further, as shown in FIG. 1E, with the patterned condensate layer in place on the structure, additional structural material 40 can be deposited, grown, or otherwise positioned on the structure at the patterned locations of condensate layer removal. Here the patterned condensate layer acts as a mask for shielding the structure from the material being added to the structure. The added material can be identical to or different from that of the structure.

Other processing techniques can be applied to the structure with the patterned condensate layer in place. For example, chemical and/or electronic doping, e.g., by ion implantation, can be carried out. Whatever structure processing is employed, the parameters of such are preferably selected to at least substantially retain the integrity of the patterned condensed layer so that the layer can operate as a mask during the structure processing. Thus, e.g., as shown in FIGS. 1D and 1E, during such processing, the structure can be retained on the structure holder in the chamber to enable maintenance of temperature and pressure. It is not required that all processing of the structure be carried out in the chamber in which the solid condensate layer was formed. So long as the integrity of the solid condensate layer is preserved, the structure processing can proceed in any suitable equipment.

For structural processing in which masking is not required, the solid condensate layer can be removed immediately after the local condensate removal by an energetic beam. Otherwise, the condensate layer is removed at an appropriate point in a fabrication sequence. For either of these scenarios, the solid condensate layer can be removed by any suitable technique. Liquid or vapor phase processing can be employed for removal of the layer.

In one particularly advantageous technique, the remaining solid condensate layer regions are removed by conversion of the layer from the solid phase to the vapor phase in a process reversing the vapor-to-solid condensate formation of the layer. Such a solid-to-vapor process minimizes residue formation on the structure, minimizes liquid surface tension effects on the structure, and minimizes waste products. For example, given a solid ice condensate layer, in situ sublimation of the layer can be accomplished by increasing the structure temperature to a temperature at which the condensate layer sublimes. This in situ sublimation process can be controlled to enable a partial thickness reduction and/or complete layer removal. Given the example solid ice condensate formation process described previously, in which an ice condensate layer was formed at a structure temperature of less than about 130 K and a pressure of less than $10^{-4}$ T, an increase in the structure temperature to about 180 K at the pressure of less than $10^{-4}$ T is found to totally remove an ice condensate layer.

It is to be recognized that the sublimation energy of a solid condensate, as a function of temperature, for a given condensate directly impacts the practical ability to sublime a layer of the condensate. For example, the rate of sublimation, $\Phi(T)$, as a function of temperature, T, for a solid ice condensate layer, can be expressed as:

$$\Phi(T) = CT^{3.5} \exp(-E_{sub}/kT), \qquad (1)$$

where C is an empirically determined constant, $E_{sub}$ is the sublimation energy, given as 0.45 eV for solid ice, and k is Boltzmann's constant. The constant C was empirically determined to be about $1.8 \times 10^{21}$ molecules/(cm$^2$s$^{3.5}$). This leads to the conclusion that at a temperature of about 128 K, a layer of solid ice condensate sublimes at a rate of only about 0.3 monolayers/hour. This expression can be employed to determine if sublimation of a solid ice condensate layer can be carried out at a temperature and/or during a time interval that is practical for a given process application.

It is further recognized that for some applications, in the course of sublimation of a condensate layer an upper layer may trap the condensate such that sublimation cannot proceed. For such a circumstance, it can be preferred to provide access apertures in the upper layer or the substrate such that sublimation of the condensate layer can be enabled. The complete sublimation of a solid condensate layer in a multilayer system can then be accomplished.

Where the sublimation temperature or times characteristic of a given solid condensate layer are not practical for a given application, the solid condensate layer can be removed by a process other than sublimation. For example, vapor processing, wet processing, or other conventional layer removal process can be employed. In addition, an energetic beam, e.g., an electron beam, can be scanned across the layer to fully remove all portions of the layer.

For many applications, however, it can be preferred that the solid condensate layer be removed as well as formed by solid-to-vapor and vapor-to-solid processes, respectively. Such enables an entirely dry deposition and removal cycle that does not require conventional processes such as liquid spinning, baking, wet processing and other such processes. The need for disposal of solvents and other environmentally harmful chemicals can therefore be avoided. But it is recognized in accordance with the invention that under certain circumstances, and for some applications, it can be preferred to employ an alternative solid condensate removal process in addition to or instead of an all-dry sublimation process. For example, in the case of a solid ice condensate layer, removal of the layer can be accomplished by simply melting to the liquid phase, and/or rinsing or other removal process alternative to or in addition to sublimation.

Figure 2A:
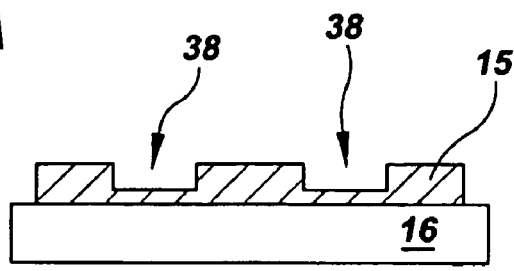
FIGS. 2A-2D are schematic cross-sectional views of example structural configurations that can be produced with the processing chamber views of FIGS. 1A-1E and associated fabrication sequences.
Figure 2B:
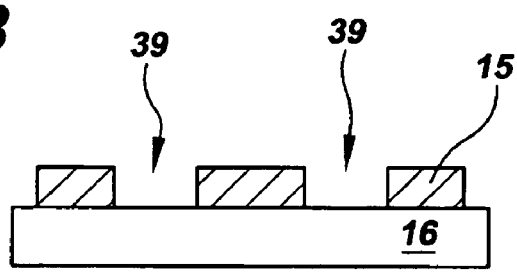
Figure 2C:
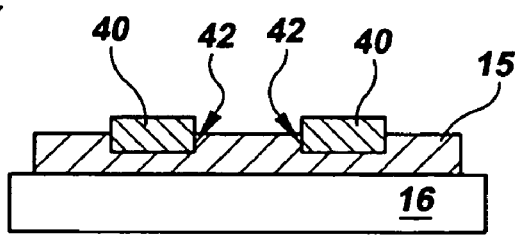
Figure 2D:
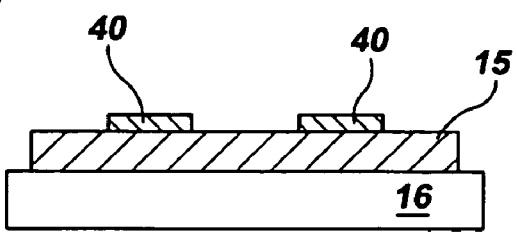

Whatever condensate removal process is employed, once such is removed from the structure, processing of the structure can be continued if desired. If processing of the structure was carried out with the condensate layer in place as a masking layer, then the structure will exhibit processing process-related features corresponding to the pattern imparted to the solid condensate layer. For example, referring to FIGS. 2A-2D, the structure 15, shown here on a structure holder 16 only for clarity, can be provided with trenched regions 38 as shown in FIG. 2A; such regions can be extended through the entire thickness of the structure to form apertures 39 or other such features as shown in FIG. 2B. As explained above, material 40 can be added to the structure 15, with the added material including a region 42 extending into the bulk of the structure 15 as shown in FIG. 2C, or sitting entirely atop the structure 15 as shown in FIG. 2D. In addition, multiple solid condensate formation, patterning, and removal cycles can be employed during a fabrication sequence.

In accordance with the invention, the processes described above for solid condensate deposition and stimulated local removal by an energetic beam can be carried out on any suitable structure and structural configuration. No particular structure regularity or planarity is required. The solid condensate deposition, processing, and removal techniques of the invention can be applied to two-dimensional, three-dimensional, planar, cylindrical, or other-shaped structures, and is in general, topology and topography independent. Microelectromechanical systems (MEMS), nanometric systems, and micro- and nano-structures are therefore well-addressed by the solid condensate processing of the invention.

In one example process in accordance with the invention, a solid condensate layer is employed to mask portions of a nanometric three-dimensional structure for enabling controlled processing of the structure. Nanotubes such as carbon nanotubes, nanowires such as silicon nanowires, and other such nanostructures, including free standing structures, can be processed in this manner. The invention contemplates a wide range of applications for which such nanostructure processing is of importance.

Considering a specific example relating to carbon nanotubes, it is found that for many applications, a known nanotube length is preferred; that is, it can be preferred to produce a carbon nanotube of a known, reproducible length. The length of the nanotube controls the mechanical stiffness, the spring constant, and other characteristics of the nanotube. As the applicability and capabilities of carbon nanotubes are expanded, the need for prespecified nanotube characteristics is increasing. But in general, it is not possible with conventional processing techniques to grow a carbon nanotube of a predefined length.

In accordance with the invention there is provided a fabrication sequence for masking and mechanically supporting a previously synthesized carbon nanotube, or many previously synthesized carbon nanotubes, to enable mechanical, chemical, or other cutting of a tube to a desired length. Referring to FIGS. 3A-3E, in a first step of such a process sequence, a nanotube 50 is provided on a nanotube holder 52 that can be provided on a structure holder 16. The structure holder is that holder 16 which was shown in FIGS. 1A-1E and described above as enabling electrical and thermal connections for control of the electrical and thermal state of a structure. Preferably the nanotube holder 52 can be mated with the structure holder 16 such that thermal and electrical connection can be made to the nanotube. The nanotube holder 52 can be provided as, e.g., an atomic force microscope (AFM) tip, or as another suitable, mechanically rigid structure, such as a cantilever structure, on which a nanotube can be provided.

The nanotube 50 can be positioned on the nanotube holder 52 in a number of ways. For many applications, it can be preferred to grow the nanotube in situ on the holder. A technique for carbon nanotube growth at a prespecified location is described in U.S. patent application Ser. No. 10/696,462, entitled, "Carbon Nanotube Device Fabrication," filed Oct. 29, 2003, published Jan. 13, 2005, as U.S. Patent Application Publication No. US 2005/0007002 A1, the entirety of which is hereby incorporated by reference. Any suitable carbon nanotube synthesis technique can be employed, however, for locating the carbon nanotube on the nanotube holder as the nanotube is grown.

Alternatively, carbon nanotubes can be synthesized at a location other than the nanotube holder and then transferred or deposited to the holder. For example, carbon nanotubes can synthesized on a substrate and then a single nanotube transferred by solution to the holder. Alternatively, nanotubes can be grown vertically from a substrate and then picked up directly onto a holder by bringing a holder into contact with a nanotube at a point along the length of the tube. A rigid attachment to the holder can be produced by, e.g., directing an electron beam to the holder to build up a carbon residue that can act as a gluing mechanism between the holder and the nanotube. It is recognized that these attachment techniques can be challenging; therefore, the in situ growth of a nanotube directly on a holder of interest is preferred.

Figure 3A:
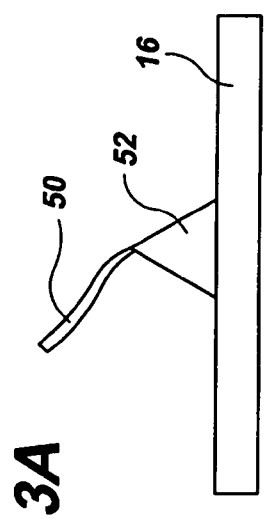
FIGS. 3A-3E are schematic views of a process provided by the invention for cutting a nanotube.
Figure 3C:
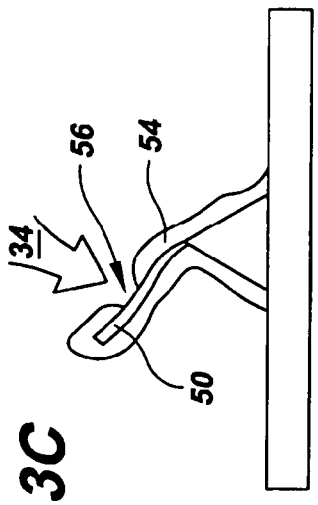
Figure 3E:
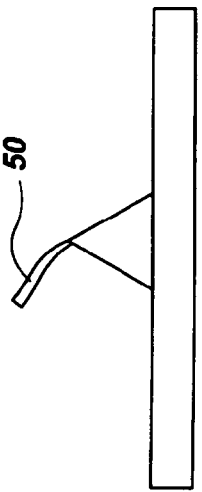
Figure 3B:
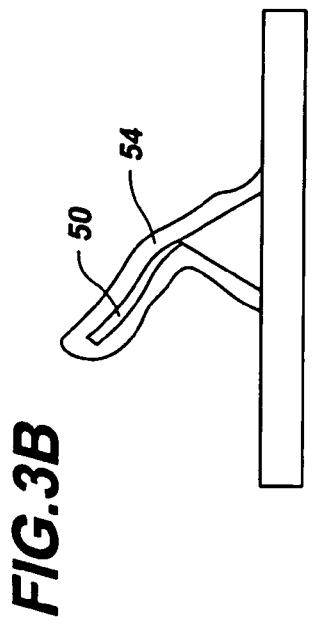

Referring now to FIG. 3B, once a nanotube 50 is located on a nanotube holder 52, the nanotube and holder are positioned on a structure holder 16 in the processing chamber 12 shown in FIG. 1A. Alternatively, the nanotube can be positioned directly on the structure holder if a configuration for enabling full access to the nanotube is enabled with the structure holder. The processing chamber is not illustrated in FIGS. 3A-3E to enhance clarity of these views, but it is to be understood that the holders in these figures are intended to be located in the process chamber described above. The process of the invention described above for producing a solid condensate layer from a vapor is then carried out to produce a solid condensate masking layer 54 on the nanotube 50. As explained above, the masking layer formation can be monitored in situ by, e.g., SEM imaging of the nanotube as the vapor condensation process progresses. In fact, the condensate formation can be employed with SEM imaging to enable imaging of the nanotube.

In one example masking layer formation process provided by the invention, a solid ice condensate layer is formed on a nanotube by exposing the nanotube to water vapor at a nanotube temperature of less than about 130 K and a local pressure of less than about $10^{-4}$ T. Under these conditions, a solid ice condensate masking layer having a thickness of as much as 1 μm can be controllably deposited on the nanotube. It is found that solid ice condensate masking layer formation can be quite directional on a three-dimensional structure such as a nanotube and therefore that the proximity of the vapor injector at its site on the process chamber to the nanotube holder location is preferably considered.

Once a masking layer is formed on a nanotube, then as shown in FIG. 3C, an energetic beam 34 is directed to a location 56 on the masking layer which corresponds to that point along the nanotube 50 that is to be cut for shortening the nanotube. An SEM or other imaging system and technique can be employed for imaging the nanotube to determine its starting length and to identify the point at which the tube is to be cut for reducing the tube length. As shown in FIG. 3C, an energetic beam 34 is then directed to that point 56 to locally remove the solid condensate masking layer 54 just at the location desired for nanotube cutting.

In accordance with the invention, any suitable energetic beam can be employed for locally removing the solid condensate masking layer. For example, an electron beam or an ion beam can be employed for locally removing a solid ice condensate masking layer in the manner described above. Alternative beam species, such as those previously described, and other suitable beam species, can also be employed. It can be preferred to employ an energetic beam species that provides a high degree of linewidth resolution, thereby to enable precise exposure of a nanotube section under the masking layer. For example, given a solid ice condensate masking layer, for many applications local removal of the layer can be most advantageously carried out with an electron beam, e.g., a 3 KeV, 50 pA electron beam. It is understood that the relatively high degree of beam focussing achievable with an electron beam makes an electron beam particularly well-suited for local removal of a solid condensate masking layer on a nanotube or other structure.

Figure 3D:
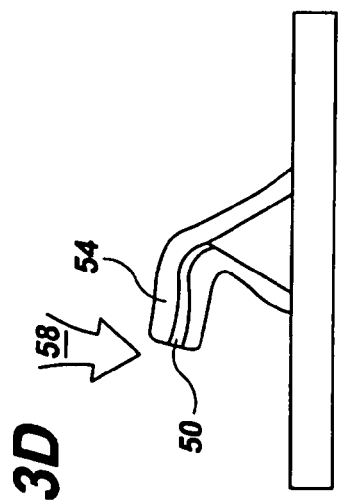

Once local removal of the solid condensate masking layer is complete, thereby exposing a location 56 of the underlying nanotube, then referring to FIG. 3D, the nanotube itself is cut. Here an energetic beam 58 is directed to the nanotube 50 at the section along the nanotube length that is exposed by the local removal of the solid condensate layer, to cut the nanotube to a desired length. The energetic beam 58 employed to cut the nanotube can be the same as or distinct from the energetic beam 34 employed to locally remove the solid condensate masking layer. Whatever nanotube cutting beam species is employed, the solid condensate masking layer acts to protect the nanotube as the cutting beam species is directed at the exposed nanotube section and focussed at that exposed section. The solid condensate masking layer further acts to protect the nanotube as the nanotube is cut at the exposed section. As a result, a highly focussed cutting beam species is not required; the linewidth of the locally removed solid condensate masking layer can be employed to set the resolution of the nanotube cutting process.

In an example of such a scenario, an electron beam can be employed to locally remove a region of a solid ice condensate masking layer on a carbon nanotube, e.g., the 3 KeV, 50 pA beam described above can be employed to locally remove an ice masking layer formed on a nanotube at a temperature of 128 K and a pressure of $10^{-4}$ T. Then an ion beam can be employed to cut the nanotube at the location of the nanotube at which the ice masking layer was locally removed. For example, a $Ga^+$ ion beam of 30 KeV in energy and an amperage of 10 pA can be employed for cutting the nanotube. Here the less focussed ion beam is employed to cut the nanotube, with the solid ice condensate layer protecting the nanotube.

The more highly focussed electron beam sets the resolution of the ion beam cutting process because the ice condensate masks the nanotube during the cutting process at locations other than that at which the condensate was locally removed. Without the masking layer, the ion beam could electrically charge up, damage, and/or displace the nanotube rather than severing the nanotube at the selected point. This dual electron beam-ion beam mask removal-nanotube cutting process can therefore be preferred for many applications.

It is recognized, however, that a common energetic beam species can be employed for both local removal of the solid condensate masking layer as well as for cutting the nanotube. For example, the electron beam parameters just described can be employed for both local removal of a masking layer as well as for cutting the nanotube. Similarly, the ion beam parameters just described can be employed for both local removal of a masking layer as well as for cutting the nanotube. It is recognized that for a given application there may be more than one beam species that can be employed for each of the local condensate removal and nanotube cutting steps.

Recognizing that the solid condensate masking layer can operate to protect the nanotube at nanotube locations other than that at which the layer has been locally removed, the masking layer can be employed to enable the application of unfocussed processing techniques only to the exposed nanotube section. In other words, processing that might otherwise harm a nanotube can be employed to operate only at the site of local masking layer removal, with the masking layer protecting all other regions of the nanotube. The only requirement is that the solid condensate masking layer be characterized by a stopping power sufficient to shield the underlying nanotube from a selected process environment.

The invention contemplates a range of process techniques for which a solid condensate masking layer can be employed to enable restricted exposure of a nanotube only at the site of local masking layer removal. For example, local doping of a nanotube can be carried out with a solid condensate masking layer in place. If ion beam implantation conditions that do not substantially harm the nanotube structure are available, ion implantation of a nanotube can be carried out with a solid condensate masking layer in place, thereby to enable a locally restricted nanotube doping. Alternatively, rubidium, chromium, or other material can be deposited, e.g., by a suitable vapor process such as chemical vapor deposition, sputtering, or evaporation, onto a nanotube section exposed by local removal of a solid condensate masking layer, to locally dope the nanotube. Any nanotube processing for which the solid condensate masking layer can operate to shield the nanotube from the processing such that only the nanotube region exposed by local removal and possible patterning of the masking layer is processed, can be carried out in accordance with the invention.

Referring to FIG. 3E, once the selected processing of the nanotube is accomplished, the solid condensate masking layer can be removed. For many applications, it can be preferred that the masking layer be removed by conversion from the solid phase back to the vapor phase. Such vaporization minimizes both the formation of residue on the nanotube and possible damage to the nanotube. In one example process provided by the invention, given a solid ice condensate masking layer, the ice condensate masking layer is sublimed by increasing the temperature of the nanotube to a temperature sufficient for sublimation at process pressures of interest. For example, at a pressure of about $10^{-4}$ T, a temperature of at least about 180 K enables sublimation of an ice condensate layer. Such is found to result in complete removal of the ice condensate layer to the vapor phase, substantially without residue or harm to the easily bent or damaged nanotube. While this direct vaporization of a condensate masking layer can be preferred for many applications, the invention does not require such. The condensate masking layer can be removed by any suitable process as explained previously, including wet chemistries as well as plasma or other vapor processes.

The nanotube cutting process just described is provided as an example of a solid condensate formation technique applied to a nanometric, three-dimensional structure that can be processed with the solid condensate acting as a masking layer. Further, for many applications, nanotubes are synthesized as free standing structures in the manner described above, supported only at one or both ends, rather than along their length. The invention enables processing, e.g., cutting, patterning, and/or doping, of such free standing structures in a fashion that is not attainable by conventional masking and patterning techniques.

The solid condensate formation process of the invention finds applicability to a wide range of micro- and nano-regime structures. Uniform, conformal condensate layers can be formed on intricate nanometric features, and high-resolution local removal and patterning of the condensate layer can enable nano-scale pattern linewidths. The invention is not limited to a particular class or configuration of three-dimensional structures. Condensation of a vapor to a solid condensate layer can be applied to any structure for which a condensation environment is amenable.

Whatever the structure on which a solid condensate layer is formed in accordance with the invention, it is found that an energetic beam directed to the condensate layer can stimulate solid state chemical reactions between the condensate layer and the underlying structure on which the layer has been formed. As an energetic beam is directed to a condensate layer, the profile of energy from the beam can extend through the entire condensate layer thickness to the interface between the condensate layer and the underlying structure, and can further penetrate the underlying structure surface, depending on the energy and other characteristics of the beam. An energy profile extending across the condensate layer-structure interface can cause constituents of the condensate and constituents of the underlying structure to interact, e.g., at the location of the interface.

In accordance with the invention, this stimulated reaction can be employed to carry out etching, or removal, of structure bulk; to carry out growth, or deposition, of material on the structure; and/or to carry out a combination of structure removal and material deposition or growth. Thus, stimulated structure surface chemistry with a condensate layer can add to and/or take away from the structure bulk. Whatever the result, such is achieved by selecting structure and condensate materials that can interact when stimulated by energy from an energetic beam directed at the solid condensate layer. At least one constituent of the condensate layer should be characterized by an ability to react with at least one constituent of the underlying structure when a source of energy is directed to the constituents.

Accordingly, the energetic beam characteristics are selected to enable the provision of energy at the condensate-structure interface so that energetic reaction between condensate species and structure species can be initiated. For example, an electron beam, proton beam, alpha particle beam, X-ray beam, or other suitable beam species can be employed. For many applications it is found that an ion beam may not be preferable in that such can result in release of atoms rather than electrons. If simulated atomic interaction is to take place for a given application, then the use of an ion beam can be suitable, however. Whatever beam species is employed, the energy of the beam is preferably tuned to optimize the local delivery of energy at the interface between the solid condensate layer and the underlying structure. The beam further can be tuned to optimize an absorption profile across the condensate and structure. For example, an X-ray beam can be tuned to be absorbed substantially at the condensate-structure interface or within the substrate itself.

It is recognized in accordance with the invention that the energetic beam can be tuned to provide energy deposition at both front and rear or other surfaces of a structure. Such can be desirable where a solid condensate layer is formed on multiple structure surfaces and chemical reaction is desired at the various surfaces. If the beam can be controlled to provide energy to the surfaces, then chemical transformation can be conducted at multiple surfaces simultaneously. The invention contemplates that an energetic beam be directed to wherever interaction between a solid condensate layer and an underlying structure material can be carried out on a structure surface.

As explained just above, the chemical surface transformation process enabled by the invention can be employed to remove or add material to the structure underlying a condensate layer. The selection of energetic beam characteristics, condensate constituents, and structure constituents enable a defined and repeatable material processing. In one example of such a process in accordance with an invention, a solid ice condensate layer of about 25 nm in thickness was formed on a silicon substrate having a <111> crystal orientation. The substrate was rinsed in deionized water and cleaned in an oxygen plasma prior to the solid ice condensate formation. The ice condensate was formed at a temperature of about 128 K and a pressure of about $10^{-4}$ T.

An electron beam of 30 KeV in energy was directed to the ice condensate layer and scanned along a one µm-long line. The electron beam dose was set at about 2 µC/cm. As the electron beam was scanned along the condensate layer, the ice condensate layer interacted with the underlying silicon substrate to oxidize the substrate only at the location of the beam scanning. This resulted in growth of an oxide layer at the location of beam scanning and conversion of a commensurate thickness of the silicon substrate to silicon dioxide. This oxidation process continued until the electron beam completely removed the ice condensate layer along the scanning path; the local oxidation of the silicon substrate terminated when the ice condensate layer was removed along the one µm-long local scanning path.

It is understood in accordance with the invention that the $H_2O$ molecules and atomic and molecular fragments of $H_2O$ in the ice condensate can be stimulated by hot electrons from an electron beam to interact with silicon atoms on or near to the silicon substrate surface for causing oxidation of the silicon substrate. The RMS roughness of the resulting oxide layer is similar in magnitude to that of the underlying silicon substrate, e.g., on the order of 0.2 nm RMS. When dipped in hydrofluoric acid, the oxide layer can be removed and corresponding trenches in the silicon substrate exposed where the oxide growth consumed the substrate material. This indicates that indeed an oxide of silicon is formed by the chemical surface interaction between the ice condensate layer and the silicon substrate.

As explained above, it is found that the stimulated local oxidation of a silicon substrate by an ice condensate layer exposed to an electron beam is a self terminating process; once the ice condensate layer is removed by the electron beam, oxidation of the silicon substrate stops. It is recognized in accordance with the invention that the localized silicon substrate oxidation, or other chemical surface transformation, can be extended by continuous formation of a condensate even as an energetic beam is directed to the existing condensate layer. For example, with continuous ice condensate formation, the substrate oxidation reaction can be controllably extended and then terminated precisely at the time condensate formation is ceased and the ice condensate is fully removed locally by an energetic beam. It is recognized in accordance with the invention that as a reaction process continues, reactive species from the condensate layer may need to be able to diffuse through a forming reaction layer to reach the underlying substrate for reaction with the substrate. The rate and duration of reaction extension is therefore preferably controlled to ensure that the condensate species can successfully reach the underlying structure for reaction with the structure.

Given this high degree of reaction controllability, it is recognized in accordance with the invention that a chemical surface transformation process can be empirically characterized to ascertain material growth rates, etch rates, and other aspects that are characteristic for a given set of process parameters. For example, the oxide growth rate and final oxide layer thickness resulting from oxidation of a silicon substrate on which an ice condensate layer is formed can be measured as a function of electron beam characteristics, ice condensate thickness, and other parameters. With such empirical data in hand, process parameters can then be set to produce a pre-specified oxide growth rate and final oxide layer thickness. The process parameters, and in particular, the ice condensate layer thickness, can therefore be employed as automatic and in situ oxide growth controls.

This automatic growth control can be particularly advantageous for applications in which an oxide or other layer to be grown is very thin. Post-processing measurement of a very thin and highly localized layer can be very difficult or even impossible. The automatic growth control enabled by the chemical surface transformation processes of the invention provides a technique for process self-regulation that eliminates the need for subsequent measurement. Correspondingly, the thickness of a solid condensate layer can be employed as a monitor of the thickness of the resulting layer to be produced by chemical surface reaction. Given that the thickness of the solid condensate layer is substantially greater than the oxide or other layer formed by interaction between the condensate layer and the underlying substrate, the condensate layer acts as a thickness amplifier. A measurement of a condensate layer thickness provides a direct correlation to the reaction layer thickness that will be formed by reaction of the condensate layer and underlying substrate. Measurement of the condensate layer thereby provides an ability to make an in situ measurement of the process conditions and the expected reaction outcome.

The invention contemplates a wide range of chemical surface reactions and other reactions that can be catalyzed by local stimulation of condensates and structures with an energetic beam. For example, local nitridation of a silicon substrate to form a nitride layer can be carried out by condensation of ammonium nitride vapor, ammonia, or other suitable vapor, on the silicon substrate and subsequent localized exposure of the condensate to an energetic beam such as an electron beam. Local etching of a structure can also be accomplished, as explained previously. For example, localized etching of a silicon substrate can be carried out by condensation of zenon difluouride vapor on the silicon substrate and subsequent localized exposure of the condensate to an electron beam. The resulting interaction of fluorine and silicon operates to etch the substrate at the location of beam interaction with the condensate and the underlying structure.

An important advantage of the chemical surface reaction processes of the invention is the high reaction localization achieved by the localized nature of an energetic beam directed to a condensate layer. The focussing capabilities of many energetic beams, and in particular electron beams, enables the linewidth resolution of the local surface reaction to be set by the linewidth of the beam. This results in a reaction region that can be localized to a substantially smaller region than that typically achievable by conventional processing techniques.

Referring back to FIGS. 2A-2D, once a localized surface chemical reaction is completed, the remaining solid condensate can be removed in the manner described above, e.g., by sublimation. The resulting structure profile then reflects the localized chemical reaction that was conducted between the solid condensate and the underlying structure. For example, referring to FIG. 2A, trenches 38 can be etched in the structure 15; this etching can be continued to entirely remove localized regions 39 of the structure, as shown in FIG. 2B. As shown in FIG. 2C, a layer 40 can be formed on the structure 15. In the scenario illustrated here, growth of the layer 40 consumed the substrate material, resulting in the layer 40 extending to a depth 42 of the structure bulk. Such is the case with oxidation of a silicon substrate, as described above.

Alternatively, as shown in FIG. 2D, a layer 40 can be formed on top of the structure 15 without consuming the structure during the layer formation process.

The invention contemplates applicability of these surface transformation processes, as well as the local condensate removal process, to layered and composite structures. The chemical surface reaction need not be carried out with a bulk material specifically; one or more layers of material provided on a structure bulk can be employed in reaction with an overlying condensate layer. Such layer processing can be advantageous for producing a patterned masking layer on a bulk structure. In this process scenario, a structural masking layer is first deposited on a substrate. Then a condensate layer is formed in the manner described above. The condensate layer is then patterned by scanning of an energetic beam in a path of interest for patterning of the structural masking layer.

The structural masking layer can then be processed to be provided with a pattern corresponding to the condensate layer pattern, or alternatively, a reaction between the condensate layer and the masking layer can be catalyzed in the manner described above as the condensate layer itself is locally removed. In either process technique, a patterned structural masking layer is produced. The patterned structural masking layer can then be employed as a conventional mask for processing underlying structure bulk.

In a further process provided by the invention, this structural masking layer patterning can be carried out on a structure that can be employed as a conventional mask itself. Considering an example of this process with an ice condensate layer employed, an ice condensate layer is formed on a suitable mask substrate, e.g., a quartz substrate or membrane structure. An energetic beam such as an electron beam is then employed to locally remove regions of the ice condensate layer to form an ice condensate mask pattern on the substrate. The ice condensate pattern can then be employed as a mask for conventional lithographic patterning. So long as process conditions allow for maintenance of the ice condensate layer, lithography can be carried out. The ice condensate mask pattern can be locally adjusted in situ by sublimation or by local stimulated removal with an energetic beam, when necessary. The mask pattern can thereby be adjusted without the need for additional mask making. This mask making process can be extended to any suitable condensate and structure materials.

This mask making technique is a further example of the wide range of structures and processes enabled by the condensate formation, localized condensate removal, and localized chemical surface interactions enabled by the invention. The use of a patterned condensate layer enables a wide range of microfabrication techniques for producing electronic and optoelectronic devices. The condensate layer can be formed of any selected vapor that condenses to the solid phase and that provides material and chemical characteristics suitable for a given application, and the condensate layer can be removed by any suitable technique, and advantageously, can be removed by sublimation. Any in a large selection of energetic beams, including conventional UV beams and electron beams, can be employed to locally remove selected regions of a solid condensate layer for patterning of the layer, and to cause controlled and local chemical reaction between the condensate layer and the underlying structure. This eliminates the need for solvents, and inhibits deleterious device effects, due to, e.g., liquid flow, contamination, and surface tension, that are commonly a challenge for liquid processing of micro- and nano-scale structures.

It is recognized, of course, that those skilled in the art may make various modifications and additions to the processes of the invention without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method for forming a nano-patterned material layer on a structure, comprising:
    condensing a vapor to an amorphous solid water condensate layer on a surface of the structure; and
    localized removal of at least one selected nanometric region of the condensate layer by directing a focused electron beam at the selected region.

2. The method of claim 1 further comprising:
    processing the structure with at least a portion of the solid condensate layer on the structure surface; and
    removing the solid condensate layer.

3. The method of claim 2 wherein processing the structure comprises selective masking of the structure surface, with a patterned solid condensate layer, from conditions of the structure processing.

4. The method of claim 2 wherein processing of the structure comprises selective etching of the structure.

5. The method of claim 4 wherein selective etching of the structure comprises formation of at least one trench in the structure.

6. The method of claim 4 wherein selective etching of the structure comprises formation of at least one aperture in the structure.

7. The method of claim 2 wherein processing of the structure comprises localized and stimulated chemical surface reaction between the solid condensate layer and the structure surface.

8. The method of claim 2 wherein processing of the structure comprises selective formation of a process material layer on the structure surface.

9. The method of claim 2 wherein processing of the structure comprises selective electrical doping of the structure.

10. The method of claim 2 wherein processing of the structure comprises exposing the structure to a beam of ions.

11. The method of claim 2 wherein processing of the structure comprises exposing the structure to a beam of electrons.

12. The method of claim 2 wherein processing of the structure comprises mechanically supporting the structure with the solid condensate layer during the structure processing.

13. The method of claim 12 wherein processing of the structure comprises selective removal of a portion of the structure.

14. The method of claim 2 wherein removal of the solid condensate layer comprises conversion of the solid condensate layer to a vapor.

15. The method of claim 14 wherein conversion of the solid condensate layer to a vapor comprises heating the structure to convert the solid condensate layer to a vapor.

16. The method of claim 14 wherein conversion of the solid condensate layer to a vapor comprises sublimation of the condensate layer.

17. The method of claim 2 wherein the structure comprises a planar structure.

18. The method of claim 2 wherein the structure comprises a nonplanar structure.

19. The method of claim 2 wherein the structure comprises a cylindrical structure.

20. The method of claim 19 wherein the structure comprises a nanowire.

21. The method of claim 19 wherein the structure comprises a nanotube.

22. The method of claim 21 wherein processing the nanotube comprises removal of a portion of the nanotube.

23. The method of claim 22 wherein removal of a portion of the nanotube comprises cutting the nanotube with an ion beam.

24. The method of claim 22 wherein the localized removal of at least one selected region of the condensate layer comprises directing a beam of energy at a location of the solid condensate layer corresponding to the nanotube portion to be removed.

25. The method of claim 24 wherein the localized removal of at least one selected region of the condensate layer comprises directing a beam of energy at a location of the solid condensate layer corresponding to a point along nanotube length at which the nanotube portion is to be removed.

26. The method of claim 1 wherein the vapor to be condensed to a solid condensate layer is supplied from a vapor source.

27. The method of claim 1 wherein the vapor to be condensed to a solid condensate layer is supplied from a liquid source.

28. The method of claim 1 wherein the vapor to be condensed to a solid condensate layer is supplied from a solid source.

29. The method of claim 1 wherein the vapor to be condensed to a solid condensate layer comprises water vapor.

30. The method of claim 29 wherein the solid condensate layer comprises ice.

31. The method of claim 1 further comprising controlling temperature and pressure conditions local to the structure surface to cause condensation of the vapor to the solid condensate layer.

32. The method of claim 31 wherein controlling temperature and pressure conditions local to the structure surface comprises providing the structure on a structure holder that is configured to control temperature of the structure.

33. The method of claim 31 wherein the controlled pressure condition local to the structure surface is characterized as a vacuum condition.

34. The method of claim 31 wherein the vapor to be condensed to a solid condensate layer comprises water vapor and the pressure local to the structure is controlled to be less than about $10^{-4}$ T.

35. The method of claim 31 wherein the vapor to be condensed to a solid condensate layer comprises water vapor and the temperature local to the structure is controlled to be less than about 180 K.

36. The method of claim 31 wherein the vapor to be condensed to a solid condensate layer comprises water vapor and the temperature local to the structure is controlled to be less than about 130 K.

37. The method of claim 1 wherein the vapor to be condensed to a solid condensate layer is injected as a vapor into a process chamber in which the structure is provided.

38. The method of claim 1 wherein the solid condensate layer includes an additive selected to optimize absorption of the beam of energy by the solid condensate layer.

39. The method of claim 1 wherein the localized removal of at least one selected region of the condensate layer comprises localized conversion of the solid condensate to a vapor at the selected region.

40. The method of claim 39 wherein the localized conversion of the solid condensate to a vapor comprises localized sublimation of the solid condensate layer at the selected region.

41. The method of claim 1 wherein the localized removal of at least one selected region of the condensate layer comprises scanning of the electron beam on the solid condensate layer along a path corresponding to a desired pattern.

42. The method of claim 1 wherein the structure comprises a planar structure.

43. The method of claim 41 wherein the structure comprises a silicon substrate.

44. The method of claim 1 wherein the structure comprises a nonplanar structure.

45. The method of claim 1 wherein the structure comprises a cylindrical structure.

46. The method of claim 44 wherein the structure comprises a nanowire.

47. The method of claim 44 wherein the structure comprises a nanotube.

48. The method of claim 1 wherein directing a focused electron beam at the selected region comprises scanning the electron beam along the selected region.

49. The method of claim 1 wherein the focused electron beam is characterized by a beam energy of between about 1 KeV and about 30 KeV.

50. The method of claim 49 wherein the focused electron beam is characterized by a beam energy of about 5 KeV.

51. The method of claim 1 wherein the focused electron beam is characterized by a beam diameter of about 5 nm.

52. The method of claim 1 further comprising draining electron beam charge from the structure, during localized region removal, by electrically grounding the structure during localized region removal.

53. A method for forming a nano-patterned material layer on a structure, comprising:
    condensing a vapor to an amorphous solid water condensate layer on a surface of the structure at a condensation rate of less than about 25 nm/sec; and
    localized removal of at least one selected nanometric region of the condensate layer by directing a beam of energy at the selected region.

54. A method for forming a nano-patterned material layer on a structure, comprising:
    condensing a vapor to an amorphous solid water condensate layer on a surface of the structure at a local pressure of less than about $10^{-6}$ T and a local temperature of less than about 130 K; and
    localized removal of at least one selected nanometric region of the condensate layer by directing a beam of energy at the selected region.

55. The method of claim 54 wherein the local pressure is less than about $10^{-4}$ T and the local temperature is about 128 K.

56. A method for forming a nano-patterned material layer on a structure, comprising:
    condensing a vapor to an amorphous solid condensate layer on a surface of the structure; and
    localized removal of at least one selected nanometric region of the condensate layer by directing a focused electron beam, characterized by a beam energy of between about 1 KeV and about 30 KeV, at the selected region.

57. A method for forming a nano-patterned material layer on a structure, comprising:
    condensing a vapor to an amorphous solid condensate layer on a surface of the structure; and
    localized removal of at least one selected nanometric region of the condensate layer by directing a focused electron beam, characterized by a beam diameter of about 5 nm, at the selected region.

58. The method of claim 21 wherein processing the nanotube comprises doping of the nanotube.

59. The method of claim 21 wherein processing the nanotube comprises vapor deposition of material on the nanotube.

60. The method of claim 24 wherein removal of a portion of the nanotube comprises cutting the nanotube with an electron beam.

61. The method of claim 56 wherein the vapor to be condensed to a solid condensate layer comprises an inert gas.

* * * * *